United States Patent
Liao et al.

(10) Patent No.: US 11,224,022 B2
(45) Date of Patent: Jan. 11, 2022

(54) RADIO NETWORK NODE AND METHOD THEREIN FOR DECIDING AGC MODE FOR A RECEIVED SIGNAL IN A WIRELESS COMMUNICATIONS NETWORK

(71) Applicant: Telefonaktiebolaget LM Ericsson (publ), Stockholm (SE)

(72) Inventors: Jichang Liao, Sollentuna (SE); Vimar Björk, Gothenburg (SE); Erik Hammarberg, Solna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 22 days.

(21) Appl. No.: 16/646,414

(22) PCT Filed: Sep. 19, 2017

(86) PCT No.: PCT/SE2017/050912
§ 371 (c)(1),
(2) Date: Mar. 11, 2020

(87) PCT Pub. No.: WO2019/059819
PCT Pub. Date: Mar. 28, 2019

(65) Prior Publication Data
US 2020/0280936 A1    Sep. 3, 2020

(51) Int. Cl.
*H04W 52/52* (2009.01)
*H04W 52/24* (2009.01)

(52) U.S. Cl.
CPC ......... *H04W 52/52* (2013.01); *H04W 52/241* (2013.01); *H04W 52/243* (2013.01)

(58) Field of Classification Search
CPC . H04W 52/52; H04W 52/241; H04W 52/243; H04B 1/109; H03G 3/3068; H03G 3/3078
See application file for complete search history.

(56) References Cited

U.S. PATENT DOCUMENTS

| | | |
|---|---|---|
| 6,563,891 B1 | 5/2003 | Eriksson et al. |
| 9,264,280 B1 | 2/2016 | Waheed et al. |

(Continued)

OTHER PUBLICATIONS

PCT International Search Report issued for PCT/SE2017/050912—dated Jun. 22, 2018.

(Continued)

*Primary Examiner* — Hoang-Chuong Q Vu
(74) *Attorney, Agent, or Firm* — Baker Botts L.L.P.

(57) ABSTRACT

A method performed by a radio network node for deciding an Automatic Gain Control (AGC) mode to be used for a received signal in a wireless communications network is provided. The radio network node estimates (301) a type of interference scenario affecting the received signal and obtains (302) information about channel quality of channels between the radio network node and connected wireless devices. Based on the estimated type of interference scenario and the obtained information about the channel quality, the radio network node dynamically decides (303) for the received signal, which AGC mode out of the following ACG modes to be used: —a slow AGC using a release timer for releasing an AGC state, —a fast AGC using a release timer for releasing an AGC state, and—a fast AGC using a trigger timer triggering an AGC state a first time interval before an interference period, and the release timer releasing the AGC state a second time interval after said interference period ends.

20 Claims, 7 Drawing Sheets

---

301. Estimate a type of interference scenario affecting the received signal.

302. Obtain information about channel quality of respective channel between radio network node and one or more connected wireless devices.

303. Based on estimated type of interference scenario and obtained information about channel quality, dynamically decide which AGC mode to be used for received signal.

304. Schedule connected wireless devices with channel status below third threshold to interference periods when the AGC comprises first AGC state, and connected wireless deviceswith channel status above third threshold to periods when AGC comprises second AGC state, which second AGC state is higher than first AGC state.

(56) References Cited

U.S. PATENT DOCUMENTS

| | | | | |
|---|---|---|---|---|
| 10,085,223 | B1* | 9/2018 | Sung | H04L 25/20 |
| 2004/0259502 | A1* | 12/2004 | Weidner | H04B 1/109 |
| | | | | 455/63.1 |
| 2008/0020751 | A1* | 1/2008 | Li | H04W 72/005 |
| | | | | 455/424 |
| 2008/0200140 | A1* | 8/2008 | Kumura | H04W 52/52 |
| | | | | 455/234.1 |
| 2010/0067626 | A1* | 3/2010 | Sankabathula | H04L 1/206 |
| | | | | 375/345 |
| 2010/0235707 | A1* | 9/2010 | Su | H03G 3/3068 |
| | | | | 714/752 |

OTHER PUBLICATIONS

PCT Written Opinion of The International Searching Authority for International application No. PCT/SE2017/050912—dated Jun. 22, 2018.

\* cited by examiner

RADIO NETWORK NODE AND METHOD THEREIN FOR DECIDING AGC MODE FOR A RECEIVED SIGNAL IN A WIRELESS COMMUNICATIONS NETWORK

PRIORITY

This nonprovisional application is a U.S. National Stage Filing under 35 U.S.C. § 371 of International Patent Application Serial No. PCT/SE2017/050912 filed Sep. 19, 2017 and entitled "RADIO NETWORK NODE AND METHOD THEREIN FOR DECIDING AGC MODE FOR A RECEIVED SIGNAL IN A WIRELESS COMMUNICATIONS NETWORK" which is hereby incorporated by reference in its entirety.

TECHNICAL FIELD

Embodiments herein relate to a radio network node and a method therein. In particular, they relate to deciding AGC mode for a received signal in a wireless communications network.

BACKGROUND

In a typical wireless communication network, wireless devices, also known as wireless communication devices, mobile stations, stations (STA) and/or user equipments (UE), communicate via a Radio Access Network (RAN) to one or more core networks (CN). The RAN covers a geographical area which is divided into service areas or cell areas, which may also be referred to as a beam or a beam group, with each service area or cell area being served by a radio network node such as a radio access node e.g., a Wi-Fi access point or a radio base station (RBS), which in some networks may also be denoted, for example, a "NodeB" or "eNodeB". A service area or cell area is a geographical area where radio coverage is provided by the radio network node. The radio network node communicates over an air interface operating on radio frequencies with the wireless device within range of the radio network node.

A Universal Mobile Telecommunications System (UMTS) is a third generation (3G) telecommunication network, which evolved from the second generation (2G) Global System for Mobile Communications (GSM). The UMTS terrestrial radio access network (UTRAN) is essentially a RAN using wideband code division multiple access (WCDMA) and/or High Speed Packet Access (HSPA) for user equipments. In a forum known as the Third Generation Partnership Project (3GPP), telecommunications suppliers propose and agree upon standards for third generation networks, and investigate enhanced data rate and radio capacity. In some RANs, e.g. as in UMTS, several radio network nodes may be connected, e.g., by landlines or microwave, to a controller node, such as a radio network controller (RNC) or a base station controller (BSC), which supervises and coordinates various activities of the plural radio network nodes connected thereto. This type of connection is sometimes referred to as a backhaul connection. The RNCs and BSCs are typically connected to one or more core networks.

Specifications for the Evolved Packet System (EPS), also called a Fourth Generation (4G) network, have been completed within the 3rd Generation Partnership Project (3GPP) and this work continues in the coming 3GPP releases, for example to specify a Fifth Generation (5G) network also referred to as New Radio (NR) network. The EPS comprises the Evolved Universal Terrestrial Radio Access Network (E-UTRAN), also known as the Long Term Evolution (LTE) radio access network, and the Evolved Packet Core (EPC), also known as System Architecture Evolution (SAE) core network. E-UTRAN/LTE is a variant of a 3GPP radio access network wherein the radio network nodes are directly connected to the EPC core network rather than to RNCs. In general, in E-UTRAN/LTE the functions of an RNC are distributed between the radio network nodes, e.g. eNodeBs in LTE, and the core network. As such, the RAN of an EPS has an essentially "flat" architecture comprising radio network nodes connected directly to one or more core networks, i.e. they are not connected to RNCs. To compensate for that, the E-UTRAN specification defines a direct interface between the radio network nodes, this interface being denoted the X2 interface.

Multi-antenna techniques can significantly increase the data rates and reliability of a wireless communication system. The performance is in particular improved if both the transmitter and the receiver are equipped with multiple antennas, which results in a Multiple-Input Multiple-Output (MIMO) communication channel. Such systems and/or related techniques are commonly referred to as MIMO.

The purpose of the automatic gain control (AGC) algorithm is to increase the dynamic range of the receiver. The receiver gain would have to change dynamically according to the input power. The device with different gain is usually referred to as the variable gain amplifier (VGA) and the algorithm adjusting its gain is the automatic gain control (AGC). FIG. 1 discloses a block diagram of a traditional AGC.

Automatic Gain Control (AGC) is widely used in wireless communication receiver. For 4G and 5G products even higher order modulation than in UMTS will be used and a lot of frequency bands are close or similar to frequency bands with military Radar operating bands. Due to this, the AGC function will be very important in order to deal with strong pulsed blocking.

When an AGC changes state, unwanted transient signals are generated. These transients may be highly energetic, and introduce non-linear distortion. The desired signal is thereby heavily distorted and a number of samples are corrupted with the result of loss of link performance. When the code rate of the signal is very high, just a few bit errors will result in block or frame errors, and the performance loss in terms of block or frame error rates may be very large.

SUMMARY

It is an object of embodiments herein to improve the performance of a wireless communications network 100.

According to a first aspect of embodiments herein, the object is achieved by a method performed by a radio network node for deciding an Automatic Gain Control, AGC, mode to be used for a received signal in a wireless communications network.

The radio network node estimates a type of interference scenario affecting the received signal and obtains information about channel quality of one or more channels between the radio network node and respective one or more connected wireless devices.

Based on the estimated type of interference scenario and the obtained information about the channel quality, the radio network node dynamically decides for the received signal, which AGC mode to be used out of:

AGC mode 1, comprising a slow AGC using a release timer for releasing an AGC state, which release timer is longer than a first threshold value, AGC mode 2, comprising a fast AGC using a release timer for releasing an AGC state, which release timer is shorter than a second threshold value, AGC mode 3, comprising the fast AGC using a trigger timer triggering an AGC state a first time interval before an interference period according to the established type of interference scenario, and the release timer releasing the AGC state a second time interval after said interference period ends.

According to a second aspect of embodiments herein, the object is achieved by a radio network node for deciding an Automatic Gain Control, AGC, mode to be used for a received signal in a wireless communications network. The radio network node is configured to estimate a type of interference scenario affecting the received signal. Furthermore, the radio network node is configured to obtain information about channel quality of one or more channels between the radio network node and respective one or more connected wireless devices.

The radio network node is configured to, based on the estimated type of interference scenario and the obtained information about the channel quality, dynamically decide for the received signal, which AGC mode to be used out of:

AGC mode 1, comprising a slow AGC using a release timer for releasing an AGC state, which release timer is longer than a first threshold value, AGC mode 2, comprising a fast AGC using a release timer for releasing an AGC state, which release timer is shorter than a second threshold value, and AGC mode 3, comprising the fast AGC using a trigger timer triggering an AGC state a first time interval before an interference period according to the established type of interference scenario, and the release timer releasing the AGC state a second time interval after said interference period ends.

Since the radio network node decides which AGC mode to use for the received signal dynamically, based on the estimated type of interference scenario and the obtained information about the channel quality, a more stable throughput and an improved coverage is achieved. This is since the channel information is used together with interference information. This results in an improved performance of the wireless communications network.

An advantage of embodiments herein is that a cell will get higher throughput, better coverage, and lower power consumption for UEs, due to optimized output power during the interference scenario.

BRIEF DESCRIPTION OF THE DRAWINGS

Examples of embodiments herein are described in more detail with reference to attached drawings in which.

DETAILED DESCRIPTION

Figure 1:
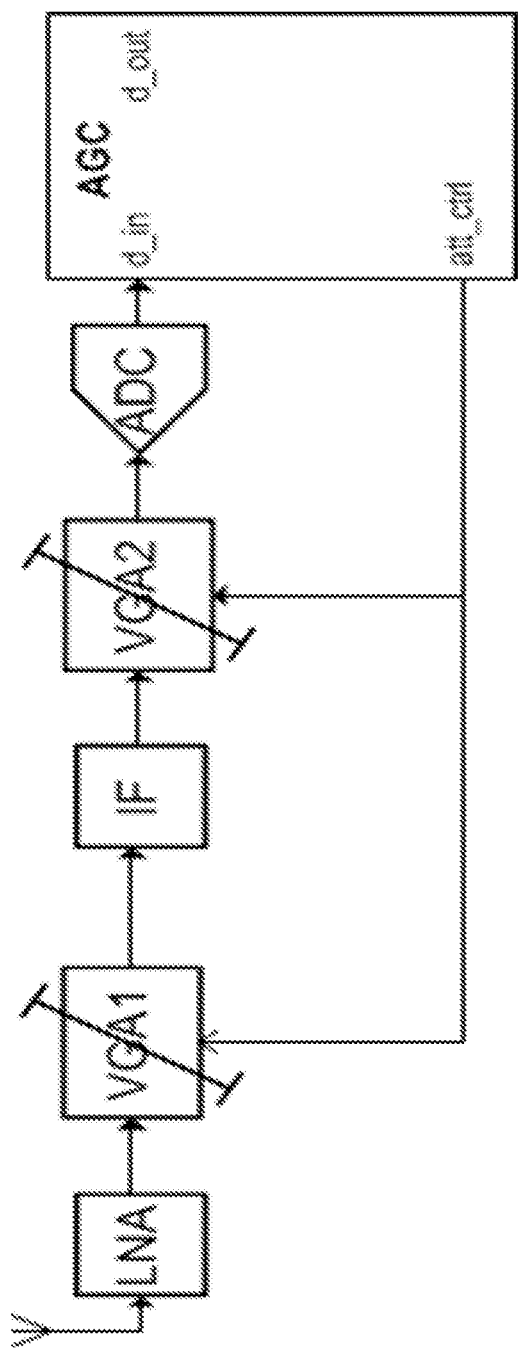
FIG. 1 is a schematic block diagram illustrating prior art.

As part of developing embodiments herein a problem will first be identified and discussed, and further, in order to enable the reader to fully understand the benefits of the current disclosure, a brief definition of some terms will be disclosed below.

Gain

Gain is defined as the ratio of the output power to the input power in dB.

NF

A Noise Figure (NF), also referred to as noise factor, is a measure of degradation of the Signal to Noise Ratio (SNR), caused by components in a Radio Frequency (RF) signal chain. It is a value by which the performance of an amplifier or a radio receiver may be specified, wherein lower values indicate better performance. The NF is the ratio of actual output noise to that which would remain if the device itself did not introduce noise, or the ratio of input SNR to output SNR.

Fast AGC

For some interference scenarios, the field strength of the interferer signals is dynamically changing due to the dynamic traffic and multipath propagation. In such an environment, the interference affecting the strength of a received signal will change over time. The AGC must be fast enough to track interferer signals that are rapidly changing. This means that AGC is required to be very fast, herein also referred to as having a short response time so that the received signal can be quickly turned back to a normal level after a pulsed interference.

When optimized for maximum sensitivity, the receiver operates at maximum gain to recover a minimum signal. In the presence of a strong interferer, also referred to as a strong blocker, the gain needs to be reduced. This is in order to avoid saturation of an ADC input, this is also referred to as desensitization. Therefore, the receiver NF will be increased and this impacts the minimum signal that can be recovered in a blocking condition.

So it is always desirable for the AGC to reduce the gain instantaneously when the interference of the interferer signals is above a predefined threshold and return to normal gain when the interference of the interferer signals has been below another predefined threshold for a short period of time, which could be on the order of one LTE symbol. In this way, the best coverage will be achieved. However, the fast transition also generates transients and a dynamically changing channel, which will degrade the receiver performance.

Slow AGC

A slow AGC has a much slower response time compared to the fast AGC and it may be on the order of several LTE frames. This will keep the receiver at a higher NF and a worse SNR for a wanted channel for much longer time than the fast AGC.

Using a fast AGC for networks with a lot of pulsed interference such as e.g. GSM, may create a lot of transitions, which will decrease the peak throughput. If instead a slow AGC is used, the cell coverage will decrease but the peak throughput will increase.

Embodiments herein comprise a scheme also referred to as algorithm, to adapt the AGC mode to use, to the environment e.g. by providing:

Dynamic AGC control based on information about channel quality of one or more channels between the radio network node 110 and respective one or more connected wireless devices 122 such as baseband user information e.g. comprising SNR and link performance.

Dynamic AGC control based on the type of interference scenario such as e.g. interference pattern.

Baseband scheduling based on scenario such as e.g. interference pattern and AGC mode.

As mentioned above, when a code rate of the signal is very high, just a few bit errors will result in block or frame errors, and the performance loss in terms of block or frame error rates may be very large. Using a fast AGC for networks with a lot of pulsed interference such as e.g. GSM, may create a lot of transitions, which will decrease the peak throughput. If instead a slow AGC is used, the cell coverage will decrease but the peak throughput will increase.

For different radio receivers there are a lot of parameters that are not the same, for example the frequency band, the application scenario and interference that varies over time. This indicates that it is difficult to achieve good uplink performance using a fixed AGC scheme.

Embodiments herein provide a method wherein the varying environment is taken into consideration when dynamically deciding which AGC mode is the most suitable to use.

Embodiments herein relate to an AGC method in e.g. a radio receiver of a radio network node within technical fields such as AGC, Radio Receiver, Dynamic Blocking, and 5G.

Example embodiments herein related to radio receiver AGC in wireless communication in general is capable to adapt the decision of which AGC mode to use based on information of connected wireless devices, also referred to as user information, and the current interference situation, also referred to as interference scenario. By this approach, the maximum throughput and cell coverage will be achieved. At the same time, power of wireless devices will be saved.

Figure 2:
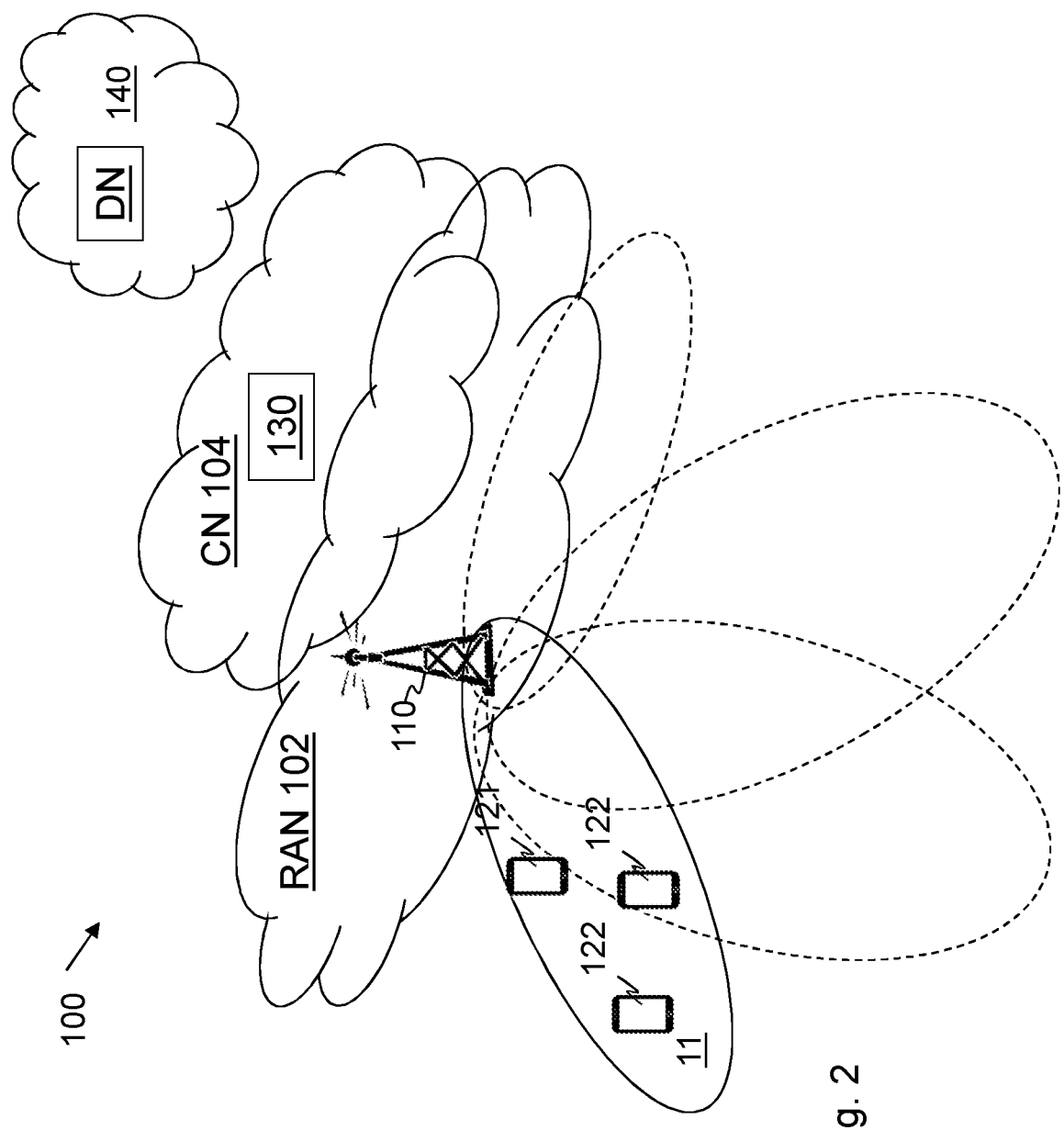
FIG. 2 is a schematic block diagram illustrating embodiments of a wireless communications network.

A wireless communications network 100, in which embodiments herein may be implemented, is schematically illustrated in FIG. 2.

The wireless communication network 100 comprises one or more RANs, e.g. a RAN 102, and one or more CNs, e.g. a CN 104. The wireless communications network 100 may be a cellular communications network, and may use a number of different technologies, such as Wi-Fi, LTE, LTE-Advanced, 5G, WCDMA, Global System for Mobile communications/enhanced Data rate for GSM Evolution (GSM/EDGE), NB-IoT just to mention a few possible implementations. Embodiments herein relate to recent technology trends that are of particular interest in a 5G context however, embodiments are also applicable in further development of the existing wireless communication systems such as e.g. GSM, WCDMA and LTE.

One or more radio network nodes such as a radio network node 110, operate in the wireless communications network 100 such as e.g. in the RAN 102. The radio network nodes such as the radio network node 110 provide radio coverage over a geographical area, which may also be referred to as a cell 11, a cluster, a beam or a beam group, of a Radio Access Technology (RAT), such as 5G, LTE, Wi-Fi or similar. The radio network node 110 may be a transmission and reception point e.g. a radio access network node such as a Wireless Local Area Network (WLAN) access point or an Access Point Station (AP STA), an access controller, a base station, e.g. a radio base station such as a NodeB, an evolved Node B (eNB, eNode B), a base transceiver station, a radio remote unit, an Access Point Base Station, a base station router, a transmission arrangement of a radio base station, a stand-alone access point or any other network unit capable of communicating with a wireless device within the service area served by the radio network node 110 depending e.g. on the radio access technology and terminology used.

Other examples of the radio network node 110 are Multi-Standard Radio (MSR) nodes such as MSR BS, network controllers, Radio Network Controllers (RNCs), Base Station Controllers (BSCs), relays, donor nodes controlling relay, Base Transceiver Stations (BTSs), Access Points (APs), transmission points, transmission nodes, Remote Radio Units (RRUs), Remote Radio Heads (RRHs), nodes in Distributed Antenna System (DAS) etc.

Wireless devices operate in the wireless communication network 100, e.g. one or more wireless devices comprising a first wireless device 121 and further one or more second wireless devices 122, also referred to as the one or more wireless devices 122. Each wireless device 121, 122 may be any of a mobile station, a non-Access Point (non-AP) STA, a STA, a user equipment and/or a wireless terminal, and communicate via one or more RANs such as the RAN 102, to one or more CNs such as the CN 104.

It should be understood by the skilled in the art that "wireless device" is a non-limiting term which means any wireless device, terminal, communications device, wireless communication terminal, user equipment, Machine-Type Communication (MTC) device, Device-to-Device (D2D) terminal, or node e.g. smart phone, laptop, mobile phone, sensor, relay, mobile tablets, an Internet-of-Things (IoT) device, e.g. a Cellular IoT (CIoT) device or even a small base station communicating within a service area. Please note the term user equipment and wireless device used in this document also covers other wireless devices such as Machine-to-Machine (M2M) devices, and IoT devices even though they do not have any user.

The radio network node 110 may be referred to as a serving radio network node and communicate with one or more wireless devices 121, 122 with Downlink (DL) transmissions to the one or more wireless devices 121, 122 and Uplink (UL) transmissions from the one or more wireless devices 121, 122. The radio network node 110 may communicate with the first wireless device 121 when connected to it, over a channel between the radio network node 110 and the first wireless device 121 at the same time as it communicates with the one or more wireless devices 122 when being connected to them, by using other channels between the radio network node 110 and respective one or more wireless devices 122.

Some actions in methods herein are performed by the radio network node 110. As an alternative, any Distributed network Node (DN) 130 and functionality, e.g. comprised in a cloud 140 may be used for performing these actions.

Example embodiments herein dynamically adjust an AGC behavior based on the user information and interference scenario. The ACG is decided to be adjusted to any of the AGC modes: AGC mode 1, AGC mode 2, or AGC mode 3.

Since the radio network node decides which AGC mode to use for the received signal dynamically, based on estimated type of interference scenario and obtained information about the channel quality, a more stable throughput and an improved coverage is achieved. This is since the channel information is used together with interference information.

AGC mode 1. According to an example scenario, all the wireless devices 122 connected in a cell provided by the radio network node 110, have a very good channel quality such as e.g. very good SNR for a wanted service. This is an indication that no connected wireless devices 122 are at the cell edge of said cell. In this example scenario, the AGC to be used shall be decided to be slow to minimize the transients from AGC transitions and to have a stable channel for the received signal. This may be referred to as AGC mode 1 and/or a slow AGC, in the text below.

AGC mode 2. According to another example embodiment herein, some wireless devices 122 connected in a cell provided by the radio network node 110, have a bad channel quality such as e.g. bad SNR for a wanted service. This is an indication that some connected wireless devices 122 are at the cell edge of said cell. If at the same time the type of interference scenario relates to pulsed interference, then the AGC should be fast to increase the channel quality such as the SNR for the wireless devices 122 at the cell edge when the interference related to the interference scenario is not present. This is referred to AGC mode 2 and/or Fast AGC without synchronization in the text below.

AGC mode 3. According to another example embodiment herein, some wireless devices 122 connected in a cell provided by the radio network node 110, have a bad channel quality such as e.g. bad SNR for a wanted service. This is an indication that some connected wireless devices 122 are at the cell edge of said cell. In this example scenario, the type of interference scenario relates to a fixed interference pattern and it may be preferred have a pre-trigger and post-release of an AGC state. As a result, a stable channel may be achieved for each symbol, time slot or frame of the channel based on what it is wanted that the radio channel synchronizes against. This is referred to AGC mode 3 and/or Fast AGC with synchronization in later chapters. For AGC mode 3, the baseband schedule users with good SNR to periods with AGC states with high NF and channel quality and schedule the users with bad SNR to the periods with AGC states with low NF.

By this dynamically adjustable AGC both better throughput and uplink coverage can be achieved at the same time as the UE can save power.

Figure 3:
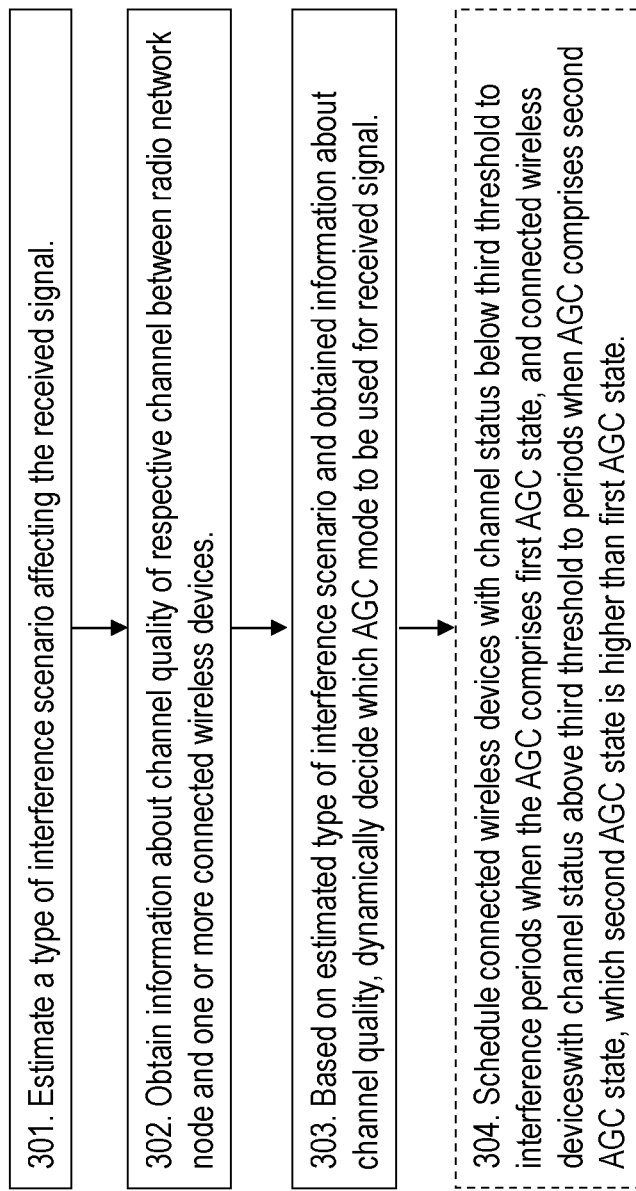
FIG. 3 is a flowchart depicting embodiments of a method in a radio network node.

Example embodiments of a method performed by a radio network node 110 for deciding an AGC mode to be used for a received signal in the wireless communications network 100 will now be described with reference to a flowchart depicted in FIG. 3. The method will first be described in a view seen from the radio network node 110 together with FIG. 3, followed by more detailed explanations and examples. Note that the received signal relates in some embodiments to one or more received signals.

The method comprises the following actions, which actions may be taken in any suitable order. Actions that are optional are presented in dashed boxes in FIG. 3.

According to an example scenario the radio network node 110 receives signals in a wireless communications network 100, e.g. from a first wireless device 121.

According to embodiments herein the radio network node 110 dynamically decides which AGC mode to use. In order to dynamically decide which AGC mode to use, the network node 110 needs to acquire information regarding the environment affecting the received signals.

Action 301

When considering environment parameters affecting a received signal, the type of interference scenario is a significant parameter. Thus, the radio network node 110 estimates, in Action 301, a type of interference scenario affecting the received signal. Herein, interference means anything which modifies or disrupts the signal to be received, e.g. caused by other wireless devices 122.

The type of interference scenario affecting the signal may e.g. comprise any one out of: Static interference, pulsed interference and random interference pattern, and pulsed interference and a fixed interference pattern.

Static interference, may be referred to as constant interference, an interference signal that is always present and does not vary considerably in time. Examples of this may be broadcasting signals for TV and radio as well as CW blocking signals defined in 3GPP.

Pulsed interference herein means an interference signal that is present at certain times and not present at other times. A pulsed interference may follow a fixed pattern, i.e. it may be possible to predict at what times the interference will be present and at what times the interference will be negligible. The pulsed interference may exhibit a random pattern, in which case it is not possible to predict when the interference will be present.

Action 302

The channel quality is another significant parameter, when considering environment parameters affecting the received signal. This is since the channel quality affects the receiver performance differently depending on what AGC mode is used. Thus, the radio network node 110 obtains information, in Action 302, about channel quality of one or more channels between the radio network node 110 and respective one or more connected wireless devices 122.

The information about the channel quality may e.g. relate to any one out of SNR, link performance, and Quality of Service (QoS).

Action 303

Based on the estimated type of interference scenario and the obtained information about the channel quality, the radio network node 110 dynamically decides, in Action 303, for the received signal, which AGC mode to be used out of:

AGC mode 1, comprising a slow AGC using a release timer for releasing an AGC state, which release timer is longer than a first threshold value, AGC mode 2, comprising a fast AGC using a release timer for releasing an AGC state, which release timer is shorter than a second threshold value, AGC mode 3, comprising the fast AGC using a trigger timer triggering an AGC state a first time interval before an interference period according to the established type of interference scenario, and the release timer releasing the AGC state a second time interval after said interference period ends.

The release timer of the slow AGC may be longer than the release timer of the fast AGC. Multiple AGC states may be comprised in the method. The multiple AGC states may be available to be triggered, and may be changed between according to any combination of those multiple AGC states.

In some embodiments, the trigger timer and the release timer of AGC mode 3 are adapted to one or more timing structures related to respective one or more connected channels to be used for respective one or more received signals. In these embodiments, the trigger timer and the release timer are adapted such that the total channel quality of the one or more received signals is above a fourth threshold. With the timing structure of the channel known, it is possible to trigger the AGC state before the interference occurs, but with as short a time period as possible between the trigger and the interference. This would be desirable from an optimization standpoint. For example, in a GSM channel it would be beneficial to trigger during the guard period and in an LTE channel it would be preferable to trigger in the cyclic prefix.

The radio network node 110 may dynamically decide, which AGC mode to be used for the received signal by deciding to use AGC mode 1 when any one out of: —The obtained information about channel quality indicates that the channel quality is above a third threshold for the one or more connected wireless devices 122, and—the type of interference scenario affecting the signal comprises static interference.

The radio network node 110 may dynamically decide, which AGC mode to be used for the received signal by deciding to use AGC mode 2 when: —The obtained information about channel quality indicates that the channel quality is above a third threshold value for some of the one or more connected wireless devices 122, and below the third threshold value for some other of the one or more connected wireless devices 122, and—the type of interference scenario affecting the signal comprises pulsed interference and random interference pattern.

The radio network node 110 may dynamically decide, which AGC mode to be used for the received signal by deciding to use AGC mode 3 when: —The obtained information about channel quality indicates that the channel quality is above a third threshold value for some of the one or more connected wireless devices 122, and below the third threshold value for some other of one or more connected wireless devices 122, and—the type of interference scenario affecting the signal comprises pulsed interference and a fixed interference pattern.

Action 304

In some embodiments, wherein AGC mode 3 is dynamically decided to be used, the radio network node 110 may schedule, in optional Action 304, the connected wireless devices 152 with channel quality below the third threshold to interference periods when the AGC comprises a first AGC state, and the connected wireless devices 122 with channel quality above the third threshold to periods when the AGC comprises a second AGC state, which second AGC state is higher than the first AGC state. By a high AGC state is here meant a state with a lower gain compared to a lower AGC state. A lower gain will result in a higher NF, which is why users with a poor channel quality are scheduled to AGC states with higher gain.

An AGC according to embodiments herein may use different states. This may comprise one AGC state when the AGC is not activated, other AGC states may be one or many and each state have a predefined lower gain compared to the other lower AGC states. How many AGC states will be used mainly depend on the system dynamic range requirements and implementation. The higher the AGC state means lower gain and higher NF, lower AGC state means higher gain and lower NF.

Embodiments herein will now be further described and exemplified. The text below is applicable to and may be combined with any suitable embodiment described above.

Figure 4:
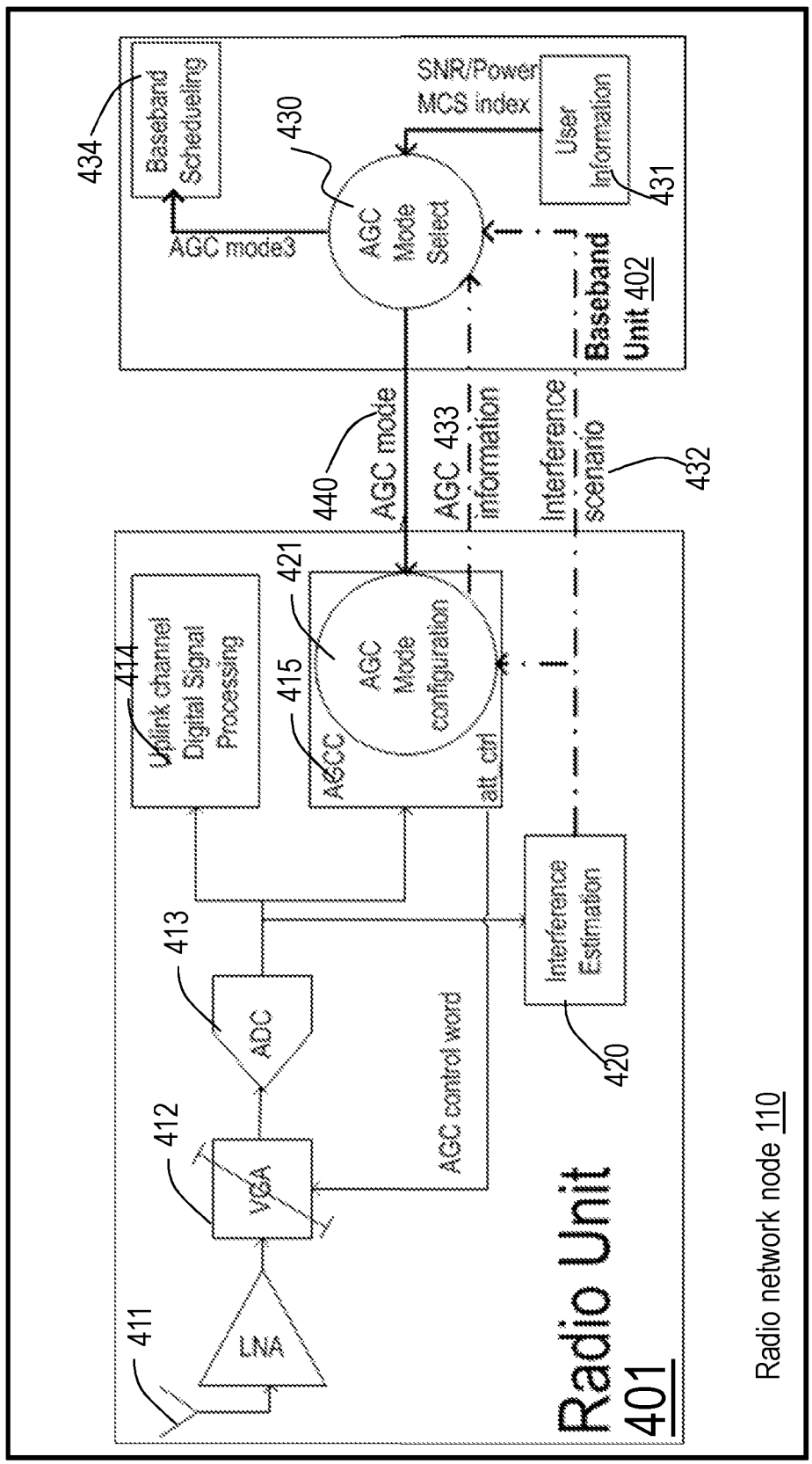
FIG. 4 is a schematic block diagram illustrating embodiments of a radio network node.

FIG. 4 shows example embodiments of a radio unit 401 and a baseband unit 402 for a radio receiver using AGC comprised in the radio network node 110 according to embodiments herein. The signal received from the antenna 410 is fed to a Low Noise Amplifier (LNA) 411. The LNA 411 will amplify the received signal to reduce the impact of thermal noise. There may be several LNAs and they may be in different places in the receiver line-up, even though only one LNA 411 is shown in FIG. 4. The amplified signal is then fed to a VGA 412 and followed by an Analog to Digital Converter (ADC) 413. The signal is fed in to an Uplink channel Digital Signal Processing part 414 wherein the signal is frequency translated to baseband, converted to a lower sample rate and channel filtered.

The step-size and dynamic range depends on the system requirements and may be modified by changing the VGA gain. The AGC Control (AGCC) part 415 follows after the ADC 413. Embodiments herein focus on the AGCC part 415. The AGC according to embodiments herein is divided into two parts with the first part in the radio unit 401, left side in FIG. 4, and the second part in the baseband unit 402, right side in FIG. 4. The AGC mode configuration and interference estimation are comprised in the radio unit 401 part. The dynamically deciding of AGC mode such as the selection of AGC mode, and AGC scheduling based on interference scenario are comprised in the baseband unit 402 part.

A typical interference will generally have a specific pattern and most of them are pulsed interference. For example, GSM interference usually repeats every GSM frame (4.615 ms) and the Radar generally have a strong and short pulsed pattern.

An interference estimation part 420 is used to estimate interference type and possible source of the interference. The input is the sampled ADC data and the output is different interference scenarios. There may e.g. be three different interference scenarios. Scenario 1 is static interference, Scenario 2 is pulsed interference with random pattern and Scenario 3 is pulsed interference with fixed pattern.

The AGC mode configuration part 421 configures AGC timing parameters based on the dynamically decided AGC mode and in some embodiments estimated interference scenario such as e.g. the identified interference pattern.

For AGC mode 1 which comprises the slow AGC, the release timers will preferably be set to longer values, such as e.g. several milliseconds. Longer release time values according to embodiments of AGC mode 1 may e.g. mean longer than the frame length of the wanted signal or longer than the repeat patter of the interference signal.

For AGC mode 2 comprising the fast AGC without synchronization, the release timers are set to shorter values such as e.g. several microseconds. Shorter release time values according to embodiments of AGC mode 2 may e.g. mean shorter than the symbol length of the wanted signal.

For AGC mode 3, except setting the release timers to shorter values, the trigger and release of AGC states will be aligned with the frame information. Frame information when used herein may e.g. mean symbol, slot or frame timing.

The part that makes the AGC mode decision also referred to as selection, is the AGC Mode Select 430 is located in the baseband unit 402. The AGC Mode Select 430 uses wireless device 122 information about channel quality also referred to as user information 431, this is from wireless devices 122 connected to the radio network node 110. The AGC Mode Select 430 further uses the output of the estimated type of interference scenario 420 performed in the radio unit 402 as input for its own AGC mode decision. The interference scenario 432 is marked as a dotted line in the block diagram of FIG. 4, which means that this part is optional because part of the interference scenario information may be estimated from the AGC information 433 that is sent out from the radio unit 402. The AGC information 433 comprises the point in time when the AGC change state and to which state it changes. There will be three different modes for the AGC: AGC mode 1 comprising slow AGC, AGC mode 2 comprising fast AGC without synchronization, and AGC mode 3 comprising fast AGC with synchronization.

Generally, which modulation, such as Modulation and Coding Scheme (MCS) index, to be used and the current channel quality for different connected wireless devices 122 may already be known before the data transmission of the first wireless device 121. Different MCS will have different behavior when an AGC transition from one state to another. Another aspect is that different channel quality could have best performance with different AGC modes. The interference scenario will also be an important input for choosing the best AGC mode.

When all wireless devices 122 have a very good channel quality with good enough SNR, AGC mode 1 is a good choice and will be decided. The interference scenario has no influence for this decision. In this way the radio network node 110 may achieve better throughput, since the AGC transition impact is minimized and the first wireless device 120 may still increase the output power to overcome the higher noise figure in its radio unit during the time when the AGC is triggered to a higher state.

When some wireless devices 122 have a bad channel quality with a low SNR, which indicates that the wireless devices 122 are located at the cell edge, it is important for the wireless devices 122 to have basic service. Basic service means access to the network with low throughput and high reliability. In this case, the current type of interference scenario will be important for the decision of AGC mode.

When the estimated type of interference scenario relates to static interferers, also referred to as interference scenario 1, AGC mode 1 will be decided to be used.

When the estimated type of interference scenario relates to pulsed interference and random pattern also referred to as interference scenario 2, AGC mode 2 will be decided to be used. The AGC mode 2 will be decided to let the wireless devices 122 with bad SNR have the possibility to get service as soon as the interference goes away.

When the estimated type of interference scenario relates to pulsed interference and a fixed pattern, also referred to as interference scenario 3, AGC mode 3 will be decided to be used. In some embodiments, the radio network node 110 such as a Baseband Scheduling 434 in the baseband unit 402, will at the same time schedule wireless devices 122 with bad SNR to the periods with AGC states with low NF and wireless devices 122 with good SNR to periods with AGC states with high NF. In this way, the best dynamic performance can be achieved for the complete wireless communications network 100.

The decided AGC mode 440 will then be sent to the radio unit 401 such as e.g. to the AGC mode configuration part 421 in the AGCC 415 for configuration of AGC timing parameters according to the decided AGC mode. Information about the dynamically decided AGC mode may be sent to the radio unit 401 e.g. by using Common Public Radio Interface (CPRI) signaling.

Figure 5:
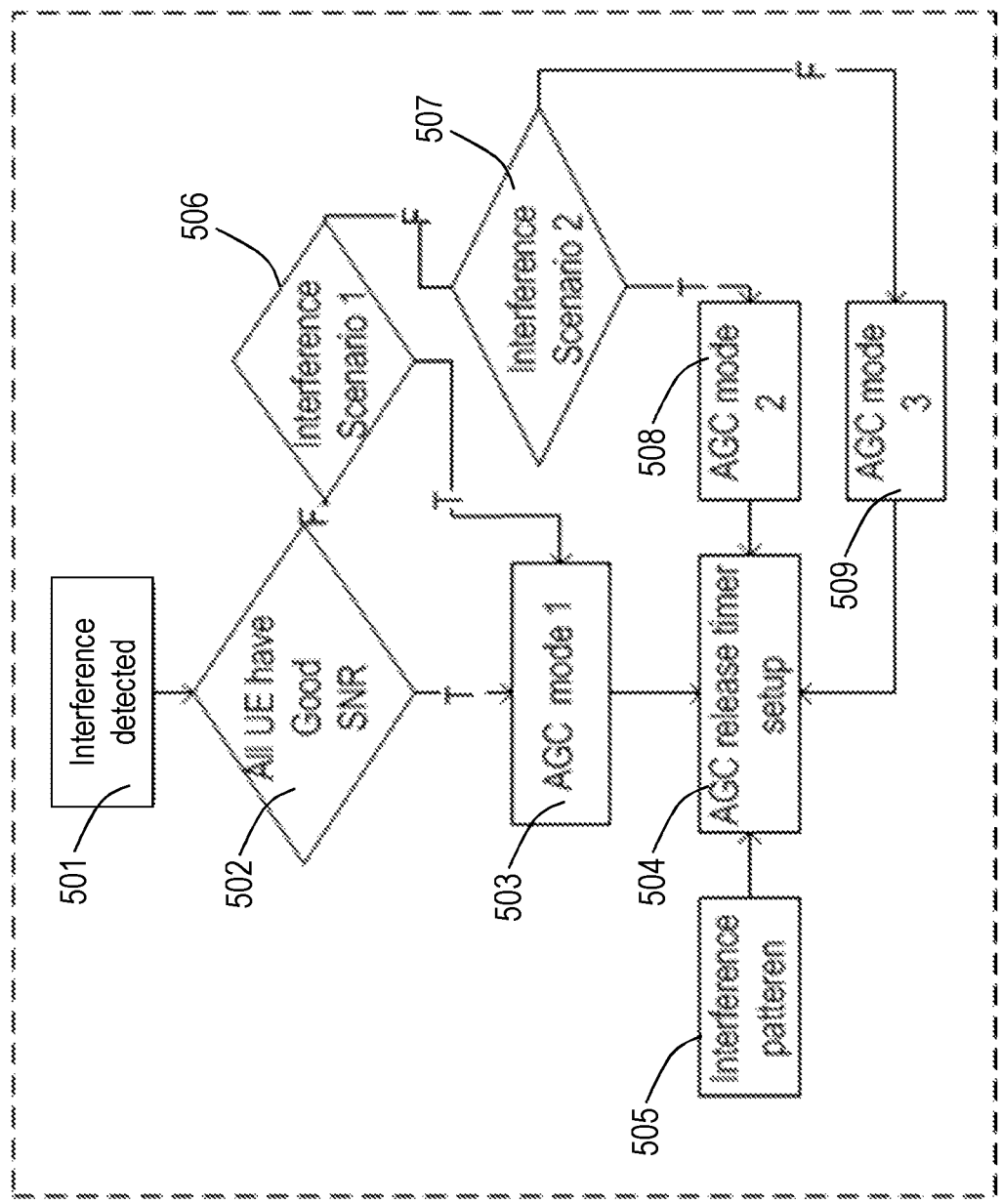
FIG. 5 is a flowchart depicting embodiments of a method.
Figure 6:
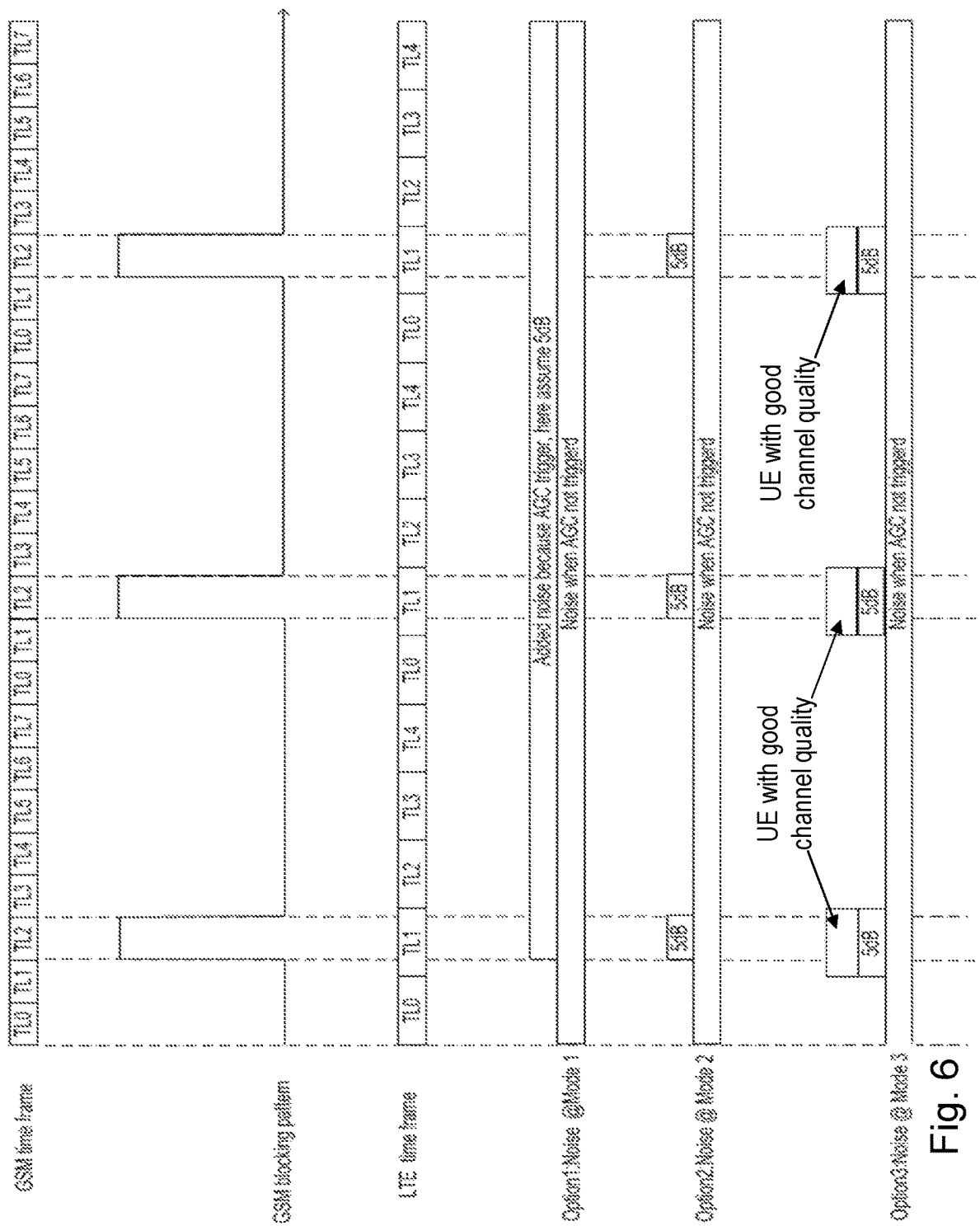
FIG. 6 schematic diagram depicting embodiments of a method.

FIG. 5 shows an example of a flow chart for ACG control such as the deciding of an AGC mode when a strong interferer is present at the radio network node 110. The flow chart is only an example and may be changed for different products such as e.g. different radio standards and how to perform the configuration depends on which performance to optimize for. For the described Options 1, 2 and 3 see FIG. 6.

The wording wanted signal when used in this document means the signal carrying the connected user's data information.

In this example an LTE carrier with pulsed GSM blocking is assumed. For the wanted signal in this scenario, LTE is assumed, and for blocking signal, a pulsed GSM signal that is active in 1 out of the 8 GSM time-slots is assumed. Depending on what AGC mode decided to be used, there will be different SNR achieved in the baseband unit 102.

FIG. 5 shows the different options and the impact on SNR and in this example the assumption is that the added noise due to AGC triggering is 5 dB.

Action 501. Interference detected means that the radio network node 110 such as its radio unit detects, in Action 501, an interference that is strong enough to desensitize the receiver and trigger an AGC state.

Action 502. The radio network node 110 obtains channel quality information from connected wireless devices 122 and checks, in Action 502, whether it is True (T) or False (F) that all wireless devices 122 have a good channel quality such as e.g. an SNR above a third threshold.

Action 503. Option 1: AGC mode 1 comprising slow AGC. When it is True (T) that all the wireless devices 122 have a good channel quality such as e.g. have enough power or can increase the power for a wanted service even when the AGC is triggered, then to achieve the best performance it is preferred to keep the AGC at a fixed state.

To achieve this, the radio network node 110 such as e.g. its AGCC 415 needs to set the AGC release timer 504 based on the estimated type of interference scenario comprising e.g. a blocking interference pattern 505 length, which in this example should be more than 4.1 ms. A blocking interference pattern length when used herein means duration of the repeated pattern of the blocking signal.

In this configuration the SNR is worse than the other configurations, but the baseband unit 402 will get a relatively stable channel without AGC transitions. Through this a better QoS can be achieved.

Action 506. Option 2: AGC mode 2 comprising fast AGC without synchronization. In this option, some wireless devices 122 are at the cell edge without the possibility to increase the output power, the result is that those wireless devices 122 will not have enough SNR for access to the wanted channel when the AGC is at a higher state. Thus it is False (F) that all the wireless devices 122 have a good channel quality.

The radio network node 110 then checks whether it is True (T) or False (F) that the estimated type of interference scenario relates to interference scenario 1 comprising static interference.

When it is True (T) that the estimated type of interference scenario relates to interference scenario 1 comprising static interference, the radio network node 110 decides that AGC mode 1, 503 shall be used.

Action 507. When it is False (F) that the estimated type of interference scenario relates to interference scenario 1 comprising static interference, the radio network node 110 then checks whether it is True (T) or False (F) that the estimated type of interference scenario relates to interference scenario, comprising pulsed interference with random pattern.

Action 508. When the blocking signal has no fixed pattern and a relatively low duty cycle, it means that it is True (T) that the estimated type of interference scenario relates to interference scenario 2 comprising pulsed interference with random pattern and the radio network node 110 decides that AGC mode 2 shall be used.

In this case the radio network node 110 such as e.g. its AGC mode configuration part 421 in the AGCC 415 will configure the release timers 504 to a short value to go back to the state with best noise figure as soon as the interferer goes away. In this way, the users at the cell edge will be able to get services during the time when the interferer is not present. In this option the AGC transitions will not be synchronized with the frame structure of LTE.

Action 509. Option 3: AGC mode 3, comprising fast AGC with synchronization. When the blocking signal has a fixed pattern, it means that it is False (F) that the estimated type of interference scenario relates to interference scenario 2 comprising pulsed interference with random pattern. Instead the estimated type of interference scenario relates to interference scenario 3 comprising a fixed interference pattern 505 and the radio network node 110 decides that AGC mode 3 shall be used.

In this option some wireless devices 122 are at the cell edge without enough SNR for access to the wanted channel with the AGC triggered to a higher state. In this case the radio network node 110 such as e.g. its AGC mode configuration part 421 in the AGCC 415 will configure the release timers 504 to a short value to go back to the state with best noise figure as soon as the interferer goes away. At the same time, the AGC controller may trigger the AGC to a higher state before the interferer such as interference pulse actually arrives, and synchronize with the LTE time frame information. TL such as TL0, TL1 etc. in the figure means time slot. In this way, a stable SNR may be achieved for each frame and wireless devices 122 with low SNR may be scheduled between the periods with high interference pulses and wireless devices 122 with good SNR is scheduled at any time and even when the high interference pulse is present.

Embodiments herein provide advantages such as e.g.:

Improved and stable throughput when radio is exhibiting a strong and pulsed blocking signal.

Improved coverage when radio is exhibiting a strong and pulsed blocking signal.

Uplink performance can be automatically optimized site by site depending on the interference scenario for each site.

UE power can be saved when base station is exhibiting a pulsed blocking signal with a fixed pattern.

Figure 7:
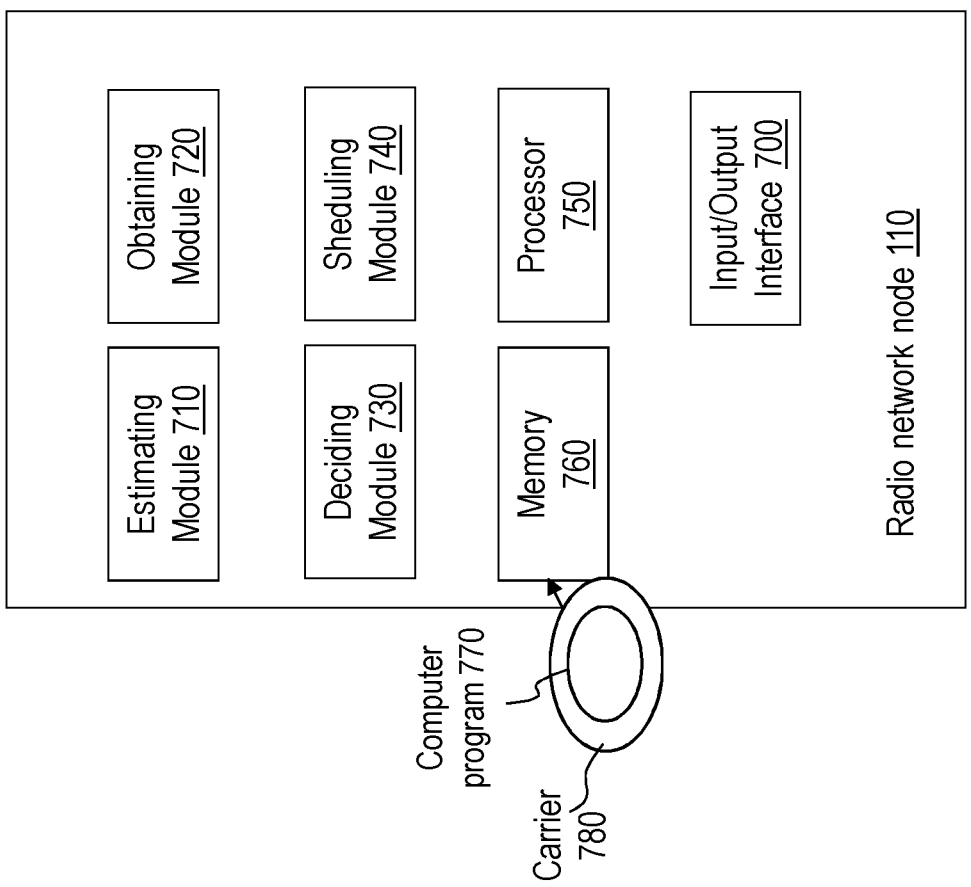
FIG. 7 is a schematic block diagram illustrating embodiments of a radio network node.

To perform the method actions for deciding an AGC mode to be used for a received signal in the wireless communications network 100 may comprise the following arrangement depicted in FIG. 7.

The radio network node 110 comprises an input and output interface 700 configured to communicate with one or more wireless devices such as the wireless device 121, 122. The input and output interface 700 may comprise a receiver (not shown) and a transmitter (not shown).

The radio network node 110 is configured to, e.g. by means of an estimating module 710 configured to, estimate a type of interference scenario affecting the received signal.

The radio network node 110 is further configured to, e.g. by means of an obtaining module 720 configured to, obtain information about channel quality of one or more channels between the radio network node 110 and respective one or more connected wireless devices 122.

The radio network node 110 is further configured to, e.g. by means of a deciding module 730 configured to, based on the estimated type of interference scenario and the obtained information about the channel quality, dynamically decide for the received signal, which AGC mode to be used out of:

AGC mode 1, comprising a slow AGC using a release timer for releasing an AGC state, which release timer is longer than a first threshold value, AGC mode 2, comprising a fast AGC using a release timer for releasing an AGC state, which release timer is shorter than a second threshold value, AGC mode 3, comprising the fast AGC using a trigger timer triggering an AGC state a first time interval before an interference period according to the established type of interference scenario, and the release timer releasing the AGC state a second time interval after said interference period ends.

In some embodiments, the trigger timer and the release timer of AGC mode 3 are to be adapted to one or more timing structures related to respective one or more connected channels to be used for respective one or more received signals. In these embodiments, the trigger timer and the release timer are arranged to be adapted such that the total channel quality of the one or more received signals is above a fourth threshold.

In some embodiments, the release timer of the slow AGC is arranged to be longer than the release timer of the fast AGC.

In some embodiments, the type of interference scenario affecting the signal is arranged to comprise any one out of:
  static interference,
  pulsed interference and random interference pattern, and
  pulsed interference and a fixed interference pattern.

In some embodiments, the information about the channel quality is adapted to relate to any one out of SNR, link performance, and QoS.

In some embodiments, the radio network node 110 is further configured to, e.g. by means of the deciding module 730 configured to, dynamically decide for the received signal which AGC mode to be used by deciding to use AGC mode 1 when any one out of:
  the obtained information about channel quality indicates that the channel quality is above a third threshold for the one or more connected wireless devices 122, and
  the type of interference scenario affecting the signal comprises static interference.

In some embodiments, the radio network node 110 is further configured to, e.g. by means of the deciding module 730 configured to, dynamically decide for the received signal which AGC mode to be used by deciding to use AGC mode 2 when:
  the obtained information about channel quality indicates that the channel quality is above a third threshold value for some of the one or more connected wireless devices 122, and below the third threshold value for some other of the one or more connected wireless devices 122, and
  the type of interference scenario affecting the signal comprises pulsed interference and random interference pattern.

In some embodiments, the radio network node 110 is further configured to, e.g. by means of the deciding module 730 configured to, dynamically decide for the received signal which AGC mode to be used by deciding to use AGC mode 3 when:
  the obtained information about channel quality indicates that the channel quality is above a third threshold value for some of the one or more connected wireless devices 122, and below the third threshold value for some other of one or more connected wireless devices 122, and
  the type of interference scenario affecting the signal comprises pulsed interference and a fixed interference pattern.

In some embodiments, wherein AGC mode 3 is dynamically decided to be used, the radio network node 110 is configured to, e.g. by means of a scheduling module 740 configured to, schedule the connected wireless devices 152 with channel quality below the third threshold to interference periods when the AGC comprises a first AGC state, and the connected wireless devices 122 with channel quality above the third threshold to periods when the AGC comprises a second AGC state, which second AGC state is higher than the first AGC state.

In some embodiments, said AGC state is adapted to comprise multiple AGC states, being available to be triggered, and changed between according to any combination of those multiple AGC states.

The embodiments herein for deciding an AGC mode to be used for a received signal in the wireless communications network 100, may be implemented through one or more processors, such as a processor 750 of a processing circuitry in the radio network node 110 depicted in FIG. 7, together with computer program code for performing the functions and actions of the embodiments herein. The program code mentioned above may also be provided as a computer program product, for instance in the form of a data carrier carrying computer program code for performing the embodiments herein when being loaded into the radio network node 110. One such carrier may be in the form of a CD ROM disc. It is however feasible with other data carriers such as a memory stick. The computer program code may furthermore be provided as pure program code on a server and downloaded to the radio network node 110.

The radio network node 110 may further comprise a memory 760 comprising one or more memory units. The memory 760 comprises instructions executable by the processor 750.

The memory 760 is arranged to be used to store configuration information, AGC states, types of interference scenarios, feedback, channel quality information, user data and applications to perform the methods herein when being executed in the radio network node 110.

In some embodiments, a computer program 770 comprises instructions, which when executed by the at least one processor 750, causes the at least one processor 750 to perform the method according to any of the Actions 301-304.

In some embodiments, a carrier 780 comprises the computer program 770, wherein the carrier is one of an electronic signal, an optical signal, an electromagnetic signal, a magnetic signal, an electric signal, a radio signal, a microwave signal, or a computer-readable storage medium.

Those skilled in the art will also appreciate that the modules in the radio network node 110, described above may refer to a combination of analog and digital circuits, and/or one or more processors configured with software and/or firmware, e.g. stored in the memory 760, that when executed by the one or more processors such as the processor 750 as described above. One or more of these processors, as well as the other digital hardware, may be included in a single Application-Specific Integrated Circuitry (ASIC), or several processors and various digital hardware may be distributed among several separate components, whether individually packaged or assembled into a system-on-a-chip (SoC).

The invention claimed is:

1. A method performed by a radio network node for deciding an Automatic Gain Control (AGC) mode to be used for a received signal in a wireless communications network, the method comprising:
   estimating a type of interference scenario affecting the received signal,
   obtaining information about channel quality of one or more channel between the radio network node and respective one or more connected wireless devices,
   based on the estimated type of interference scenario and the obtained information about the channel quality, dynamically deciding for the received signal, which AGC mode to be used out of:
   AGC mode 1, comprising a slow AGC using a release timer for releasing an AGC state, which release timer is longer than a first threshold value,
   AGC mode 2, comprising a fast AGC using a release timer for releasing an AGC state, which release timer is shorter than a second threshold value, and
   AGC mode 3, comprising the fast AGC using a trigger timer triggering an AGC state a first time interval before an interference period according to the established type of interference scenario, and the release timer releasing the AGC state a second time interval after said interference period ends.

2. The method according to claim 1, wherein the trigger timer and the release timer of AGC mode 3 are adapted to one or more timing structures related to respective one or more connected channels to be used for respective one or more received signals, and wherein the trigger timer and the release timer are adapted such that the total channel quality of the one or more received signals is above a fourth threshold.

3. The method according to claim 1, wherein the release timer of the slow AGC is longer than the release timer of the fast AGC.

4. The method according to claim 1, wherein the type of interference scenario affecting the signal comprises any one out of:
   static interference,
   pulsed interference and random interference pattern, and
   pulsed interference and a fixed interference pattern.

5. The method according to claim 1, wherein the information about the channel quality relates to any one out of Signal to Noise Ratio (SNR) link performance, and Quality of Service (QoS).

6. The method according to claim 1, wherein dynamically deciding for the received signal, which AGC mode to be used comprises deciding to use AGC mode 1 when any one out of:
   the obtained information about channel quality indicates that the channel quality is above a third threshold for the one or more connected wireless devices, and
   the type of interference scenario affecting the signal comprises static interference.

7. The method according to claim 1, wherein dynamically deciding for the received signal, which AGC mode to be used comprises deciding to use AGC mode 2 when:
   the obtained information about channel quality indicates that the channel status is above a third threshold value for some of the one or more connected wireless devices, and below the third threshold value for some other of the one or more connected wireless devices, and
   the type of interference scenario affecting the signal comprises pulsed interference and random interference pattern.

8. The method according to claim 1, wherein dynamically deciding for the received signal, which AGC mode to be used comprises deciding to use AGC mode 3 when:
   the obtained information about channel quality indicates that the channel quality is above a third threshold value for some of the one or more connected wireless devices, and below the third threshold value for some other of one or more connected wireless devices, and
   the type of interference scenario affecting the signal comprises pulsed interference and a fixed interference pattern.

9. The method according to claim 1, wherein AGC mode 3 is dynamically decided to be used, the method further comprising:
   scheduling the connected wireless devices with channel quality below the third threshold to interference periods when the AGC comprises a first AGC state, and the connected wireless devices with channel quality above the third threshold to periods when the AGC comprises a second AGC state, which second AGC state is higher than the first AGC state.

10. The method according to claim 1, wherein said AGC state comprises multiple AGC states, being available to be triggered, and changed between according to any combination of those multiple AGC states.

11. A radio network node for deciding an Automatic Gain Control (AGC) mode to be used for a received signal in a wireless communications network, the radio network node comprising processing circuitry configured to:
  estimate a type of interference scenario affecting the received signal,
  obtain information about channel quality of one or more channel between the radio network node and respective one or more connected wireless devices,
  based on the estimated type of interference scenario and the obtained information about the channel quality, dynamically decide for the received signal, which AGC mode to be used out of:
  AGC mode 1, comprising a slow AGC using a release timer for releasing an AGC state, which release timer is longer than a first threshold value,
  AGC mode 2, comprising a fast AGC using a release timer for releasing an AGC state, which release timer is shorter than a second threshold value, and
  AGC mode 3, comprising the fast AGC using a trigger timer triggering an AGC state a first time interval before an interference period according to the established type of interference scenario, and the release timer releasing the AGC state a second time interval after said interference period ends.

12. The radio network node according to claim 11, wherein the trigger timer and the release timer of AGC mode 3 are to be adapted to one or more timing structures related to respective one or more connected channels to be used for respective one or more received signals, and wherein the trigger timer and the release timer are to be adapted such that the total channel quality of the one or more received signals is above a fourth threshold.

13. The radio network node according to claim 11, wherein the release timer of the slow AGC is arranged to be longer than the release timer of the fast AGC.

14. The radio network node according to claim 11, wherein the type of interference scenario affecting the signal is arranged to comprise any one out of:
  static interference,
  pulsed interference and random interference pattern, and
  pulsed interference and a fixed interference pattern.

15. The radio network node according to claim 11, wherein the information about the channel quality is adapted to relate to any one out of Signal to Noise Ratio (SNR) link performance, and Quality of Service (QoS).

16. The radio network node according to claim 11, wherein the processing circuitry is configured to dynamically decide for the received signal which AGC mode to be used by deciding to use AGC mode 1 when any one out of:
  the obtained information about channel quality indicates that the channel quality is above a third threshold for the one or more connected wireless devices, and
  the type of interference scenario affecting the signal comprises static interference.

17. The radio network node according to claim 11, wherein the processing circuitry is configured to dynamically decide for the received signal which AGC mode to be used by deciding to use AGC mode 2 when:
  the obtained information about channel quality indicates that the channel quality is above a third threshold value for some of the one or more connected wireless devices, and below the third threshold value for some other of the one or more connected wireless devices, and
  the type of interference scenario affecting the signal comprises pulsed interference and random interference pattern.

18. The radio network node according to claim 11, wherein the processing circuitry is configured to dynamically decide for the received signal which AGC mode to be used by deciding to use AGC mode 3 when:
  the obtained information about channel quality indicates that the channel quality is above a third threshold value for some of the one or more connected wireless devices, and below the third threshold value for some other of one or more connected wireless devices, and
  the type of interference scenario affecting the signal comprises pulsed interference and a fixed interference pattern.

19. The radio network node according to claim 11, wherein AGC mode 3 is dynamically decided to be used, the processing circuitry is configured to:
  schedule the connected wireless devices with channel quality below the third threshold to interference periods when the AGC comprises a first AGC state, and the connected wireless devices with channel quality above the third threshold to periods when the AGC comprises a second AGC state, which second AGC state is higher than the first AGC state.

20. The radio network node according to claim 11, wherein said AGC state is adapted to comprise multiple AGC states, being available to be triggered, and changed between according to any combination of those multiple AGC states.

* * * * *